United States Patent [19]

Katoh

[11] Patent Number: 5,408,188

[45] Date of Patent: Apr. 18, 1995

[54] HIGH FREQUENCY WAFER PROBE INCLUDING OPEN END WAVEGUIDE

[75] Inventor: Takayuki Katoh, Itami, Japan

[73] Assignee: Mitsubishi Denki Kabushiki Kaisha, Tokyo, Japan

[21] Appl. No.: 995,695

[22] Filed: Dec. 23, 1992

[30] Foreign Application Priority Data

Jul. 17, 1992 [JP] Japan ................................ 4-213552

[51] Int. Cl.$^6$ .............................................. G01R 1/04
[52] U.S. Cl. ...................................... 324/757; 333/26
[58] Field of Search ........ 324/158 P, 158 F, 754-769; 333/26

[56] References Cited

U.S. PATENT DOCUMENTS 4,697,143 9/1987 Lockwood et al. ............. 324/158 P
5,262,739 11/1993 Dalman ................................ 333/26

Primary Examiner—Kenneth A. Wieder
Assistant Examiner—B. Bowser
Attorney, Agent, or Firm—Leydig, Voit & Mayer

[57] ABSTRACT

A high frequency wafer probe for measuring characteristics of a device operating in a high frequency range includes a waveguide serving as a grounding conductor of the probe, an end of which is open, having a tip and extending from an upper wall of the waveguide in the vicinity of the open end which gradually increases in extent as it approaches the open end and the tip; a signal contact part disposed on a tip of the ridge for contacting a signal input terminal of a device under test; and a plurality of grounding contact parts disposed on the same plane as the signal contact part opposite to each other with the signal contact part between two of the signal contact parts for contacting a plurality of grounding terminals of a device under test. In this structure, the contact parts of the probe can be accurately positioned on the terminals of an IC chip under test, and the contact conditions are easily visually confirmed. In addition, a high frequency wafer probe with low loss and low reflection is achieved.

6 Claims, 20 Drawing Sheets

HIGH FREQUENCY WAFER PROBE INCLUDING OPEN END WAVEGUIDE

FIELD OF THE INVENTION

The present invention relates to a high frequency wafer probe for measuring characteristics of an IC chip operating in the millimeter wave band above 60 GHz.

BACKGROUND OF THE INVENTION

FIGS. 11(a) to 11(c) are diagrams showing typical microwave waveguides for transmitting microwave signals, in which FIG. 11(a) shows a coaxial line, FIG. 11(b) shows a coplanar line, and FIG. 11(c) shows a rectangular waveguide.

In FIG. 11(a), the coaxial line 150 comprises a signal conductor 111, a grounding conductor 114, and a dielectric 113, such as teflon, filling the space between the signal conductor and the grounding conductor. This coaxial line has a good shielding property and mechanical flexibility. Microwave signals in a frequency band ranging from DC to 60 GHz are transmitted by the coaxial line. For example, in a coaxial line for transmitting microwave signals at 40 GHz, the signal conductor 111 has a diameter of 2 to 3 mm and the grounding conductor 114 has an inside diameter of about 5 mm.

In FIG. 11(b), the coplanar line 151 includes a signal conductor 121 disposed on a dielectric substrate 123 and two grounding conductors 122 disposed on opposite sides of the signal conductor 121. In this structure, since the signal conductor 121 and the grounding conductors 122 are in the same plane, probing from above is easily carried out. In addition, since the degree of freedom in employing frequencies is high, it is widely used in ICs operating at high frequencies and high frequency wafer probes for measuring characteristics of the high frequency band ICs. The coplanar line transmits microwave signals in a frequency band ranging from DC to 150 GHz.

In FIG. 11(c), the waveguide 152 comprises a rectangular grounding conductor 134 filled with air. Since the waveguide 152 has neither a core conductor nor a dielectric which cause an increase in loss, attenuation of high-frequency waves is smaller than in the coaxial line. However, the available frequency range is only 30–50% of design frequency range and, particularly, the DC signal cannot be transmitted. The grounding conductor 134 usually comprises Zn or Cu, and a good conductor, such as Au, is plated onto the internal wall to a thickness of 2 to 3 microns to reduce the loss. This waveguide transmits microwave signals at a frequency band ranging from 40 to 300 GHz. In a waveguide for transmitting microwave signals in 40 GHz the cross-sectional area of the rectangular grounding conductor 134 is 4~5 mm×2~3 mm. The higher the frequency transmitted is, the smaller the sectional area of the waveguide becomes. In a waveguide for transmitting microwave signals at 100 GHz, the cross-sectional area is about 1.2 mm×0.5 mm.

FIG. 18 is a schematic diagram illustrating an apparatus for measuring characteristics of a high frequency band IC. In the figure, reference numeral 201 designates a measuring apparatus body and numeral 204 designates an IC chip to be measured. A first probe 203a and a second probe 203b are connected to the measuring apparatus 201 by a first connecting cable 202a and a second connecting cable 202b, respectively. In the measurement, the first probe 203a is applied to a signal input terminal 205a of the IC chip and the second probe 203b is applied to a signal output terminal 205a of the IC chip.

A coaxial line (DC~60 GHz) or a waveguide (40~300 GHz) are generally used as the cables 202a and 202b connecting the high frequency wafer probes to the measuring apparatus and a coplanar line structure is generally employed for the input or output interface part of the high frequency band IC. Therefore, the coaxial line or the waveguide must be converted to the coplanar line in the probe.

FIG. 12 is an exploded perspective view illustrating a coaxial type high frequency wafer probe in which a coaxial cable is converted to a coplanar line. In FIG. 12, reference numeral 105 designates a probe cover, numeral 106 designates a dielectric blade with a coplanar line structure on its rear surface, and numeral 107 designates a probe body comprising a conductor. A socket 112 comprising a conductor is connected to the probe body 107. An end of a coaxial cable 150 is inserted into the socket 112 and fixed by a nut 115. A tip of the signal conductor 111 of the coaxial cable 150 protrudes to a region where the dielectric blade 106 is to be disposed.

FIG. 13 shows the under surface of the dielectric blade 106. The dielectric blade 106 comprises a dielectric plate 103, a signal conductor 101, grounding conductors 102, a signal contact part 109 disposed on the end of the signal conductor 101, and grounding contact parts 110 disposed on the ends of the grounding conductors 102.

FIG. 14 is a sectional view of the probe of FIG. 12, illustrating the coaxial cable to coplanar line (dielectric blade) transition part. In FIG. 14, the core conductor 111 of the coaxial cable is connected to the signal conductor 101 of the coplanar line. The grounding conductor 114 of the coaxial cable is in contact with the socket 112 fixed to the probe body 107, and the grounding conductors 102 (not shown in FIG. 14) of the coplanar line are in contact with the probe body 107, whereby the grounding conductor 114 of the coaxial cable is electrically connected to the grounding conductors 102 of the coplanar line. In addition, reference numeral 116 designates a conductive member adhered to the coaxial cable 150, through which the coaxial cable 150 is fixed to the probe body 107 by the socket 112 and the nut 115.

FIG. 15(a) is a side view of a waveguide type high frequency wafer probe in which an waveguide is converted to a coplanar line. FIG. 15(b) is an exploded perspective view of the waveguide to coplanar line transition part included in the probe of FIG. 15(a). In FIG. 15(b), a dielectric blade 106 is clamped between upper and lower halves 154a and 154b of the grounding conductor of the waveguide 152. A ridge 118 is disposed on the internal upper wall of the upper grounding conductor 154a. The height of the ridge increases stepwise as it approaches the front end of the grounding conductor, and a tip of the ridge 18 is in contact with a signal conductor of the dielectric blade 106.

A method of connecting the coplanar line (dielectric blade) to the waveguide is illustrated in FIGS. 16(a) and 16(b). FIG. 16(b) is a cross section taken along line XVIb—XVIb of FIG. 16(a). As shown in FIG. 16(b), the end portion of the ridge 118 is connected to the signal conductor 101 of the coplanar line by a lead wire 155.

FIG. 17 is a perspective view illustrating characteristic measurement of a high frequency band IC using either of the conventional high frequency wafer probes shown in FIG. 12 and FIGS. 15(a)–15(b). In FIG. 17, an input or output interface part of a high frequency band IC 160 has a coplanar line structure including a signal electrode pad 162 disposed on an end of a signal conductor disposed on a semiconductor substrate 161 and grounding electrode pads 163 connected to a rear grounding conductor 170 disposed on the rear surface of the substrate 161 through via-holes 164. On the other hand, the conventional probe has the dielectric blade 116, i.e., the downward-looking coplanar line, at the end thereof, and the signal contact part 109 and the grounding contact parts 110 are applied to the signal electrode pad 162 and the grounding electrode pads 163 of the IC 160, respectively.

The application of the high frequency wafer probe to the input or output interface part of the high frequency band IC shown in FIG. 17 is identical to the application of the first or second high frequency wafer probe to the input or output terminal of the high frequency band IC shown in FIG. 18. When the first and second probes 203a and 203b are in contact with the input and output terminals 205a and 205b of the IC chip 204, respectively, millimeter wave signals at about 100 GHz are applied to the input terminal 205a from the first probe 203a, and microwave signals output to the output terminal 205b are taken out by the second probe 203b. The microwave signals are sent to the measuring apparatus 201 through the cable 202b, where the characteristics of the IC chip are measured.

Since the conventional probes shown in FIG. 12 and FIGS. 15(a)–15(b) have a two-stage transition, i.e., a first transition from the coaxial cable to the dielectric blade (coplanar line) and a second transition from the dielectric blade to the interface part (coplanar line) of the IC, the transmission losses and reflection losses at the transition parts unfavorably increase. A loss caused by the transition from the dielectric blade to the interface part of the IC is as small as 0.2 dB. However, about 0.4 dB loss occurs in a transition from a 20~30 GHz band coaxial cable to the dielectric blade of a coplanar line, and about 0.8 dB loss occurs in a transition from a 100 GHz band waveguide to the dielectric blade.

FIGS. 19(a) and 19(b) are diagrams illustrating a high frequency wafer probe with a direct transition from a waveguide to a coplanar line of an IC chip, disclosed in Japanese Published Patent Application No. 4-100711, in which FIG. 19(a) is a perspective view thereof and FIG. 19(b) is a cross section taken along line XIXb—XIXb of FIG. 19(a).

This high frequency wafer probe 320 comprises a horizontal waveguide 320a and a vertical waveguide 320b united with the horizontal waveguide 320a. Ground contact parts 323, which can be connected to grounding electrode pads on an input or output interface part of a high frequency band IC chip (not shown), are disposed on the under surface 320d of the waveguide 320a. An aperture 320c is located between the grounding contact parts 323. A conductive ridge 322 is disposed on the internal upper wall of the horizontal waveguide 320a, and the height of the ridge increases stepwise as it approaches the front end of the waveguide 320a. A signal contact part 324, which can be connected to a signal electrode pad of the input or output interface part of the high frequency signal IC chip, is disposed on the tip of the ridge 322 and protrudes through the aperture 320c.

Since the high frequency wafer probe 320 thus constituted includes neither a waveguide to coplanar line transition part nor a dielectric blade of a coplanar line structure, loss of signal strength in the millimeter wave band is reduced, resulting in a characteristic measurement with high precision.

In the characteristic measurement of a high frequency band IC using the high frequency wafer probe 320 shown in FIGS. 19(a) and 19(b), however, the contact parts 323 and 324 of the probe are hidden from view by the horizontal waveguide 320a as shown in FIG. 20(a), resulting in difficulty in positioning the contact parts of the probe accurately on the electrode pads of the IC chip as well as in confirming the contact condition between the contact parts and the electrode pads. Particularly when the electrode pads of the IC chip have different heights, for example, when the grounding electrode pads 163 are higher than the signal electrode pad 162 as shown in FIG. 20(b), an imperfect or faulty contact occurs between the signal contact part 324 and the signal electrode pad 162, which is hard to find in the conventional structure. In addition, since the front end of the horizontal waveguide 320a is covered with the grounding conductor, the probe must be designed considering reflections of high-frequency components at the front end.

SUMMARY OF THE INVENTION

It is an object of the present invention to provide a high frequency wafer probe having low loss and low reflection in a high frequency band, particularly in a millimeter wave band above 60 GHz where a coaxial cable cannot be employed, and having no difficulty in positioning contact parts of the probe on electrode pads of an IC chip to be tested as well as in confirming the contact condition between them.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, a high frequency wafer probe includes a waveguide an end of which is open; a ridge disposed on the internal upper wall of the waveguide, the height of which gradually increases as it approaches the open end of the waveguide; a signal contact part disposed on the tip of the ridge for contacting a signal input terminal of an IC chip to be tested; and a plurality of grounding contact parts disposed in the same plane as the signal contact part opposite each other with the signal contact part between for contacting a plurality of grounding terminals of the IC chip. This probe has a direct transition from the waveguide to the coplanar line of the IC interface part. Therefore, the contact parts of the probe are accurately positioned on the electrode pads of the IC chip, and the contact conditions are easily confirmed. In addition, a high frequency wafer probe with low loss and low reflection is achieved.

DETAILED DESCRIPTION OF THE PREFERRED EMBODIMENTS

Figure 1A:
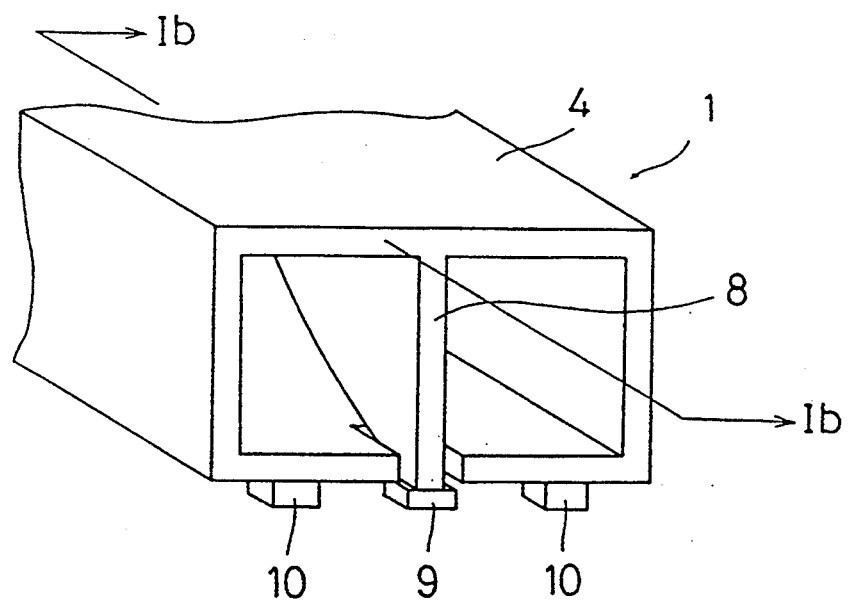
FIG. 1(a) is a perspective view illustrating a high frequency wafer probe according to a first embodiment of the present invention and FIG. 1(b) is a cross section taken along line Ib—Ib of FIG. 1(a)
Figure 1B:
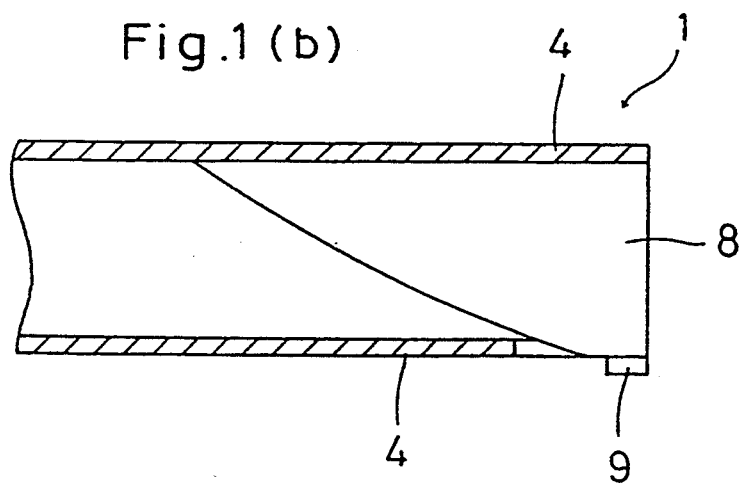

FIGS. 1(a) and 1(b) are diagrams illustrating a high frequency wafer probe in accordance with a first embodiment of the present invention, in which FIG. 1(a) is a perspective view and FIG. 1(b) is a cross section taken along line Ib—Ib of FIG. 1(a). In the FIGS., reference numeral 4 designates a grounding conductor of a high frequency wafer probe 1, which is an end portion of a rectangular waveguide. A ridge 8 comprising a conductor is disposed on the internal upper wall of the grounding conductor 4, the height of which gradually increases toward the end of the waveguide. A portion of the lower end of the grounding conductor 4 is removed and a tip of the ridge 8 protrudes through that portion. A signal contact part 9 is disposed on the tip of the ridge 8. Ground contact parts 10 are disposed on the under surface of the grounding conductor 4 opposite each other with the signal contact part 9 between there. The center-to-center space between the signal contact part 9 and the grounding contact part 10 is 100 to 250 microns.

Figure 2:
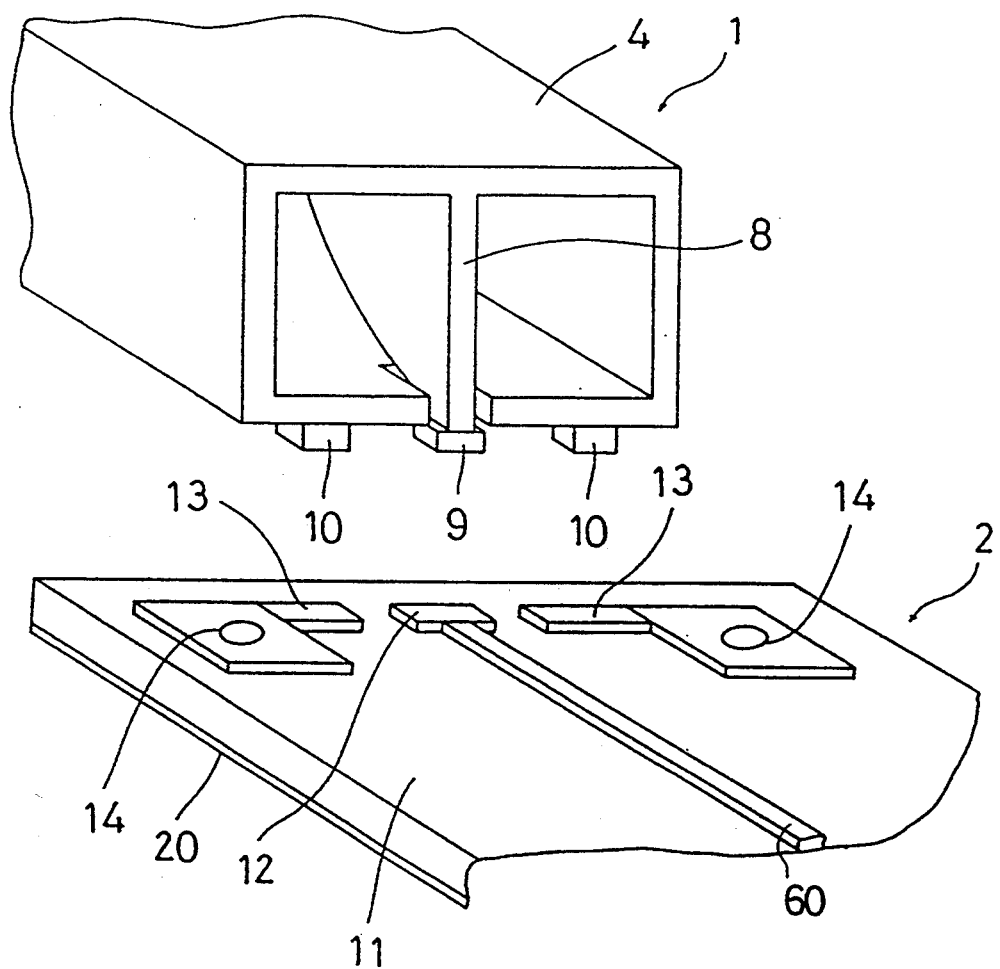
FIG. 2 is a perspective view illustrating characteristic measurement of a high frequency band IC using the probe of FIGS. 1(a) and 1(b)

FIG. 2 is a perspective view illustrating characteristic measurement of a high frequency band IC using the probe of FIGS. 1(a) and 1(b). In FIG. 2, an input or output interface part of the high frequency band IC chip 2 has a coplanar line structure including a signal electrode pad 12 disposed on an end of a signal conductor 60 that is disposed on a semiconductor substrate 11 and two grounding electrode pads 13 connected to grounding conductors 20 disposed on the rear surface of the substrate 11 through via-holes 14. When characteristics of the IC chip 2 are measured using the high frequency wafer probe 1 according to the first embodiment, the signal contact part 9 and the grounding contact parts 10 of the probe are applied to the signal electrode pad 12 and the grounding electrode pads 13 of the IC chip 2, respectively. Since the spaces between the electrode pads 12 and 13 are equal to the spaces between the contact parts 9 and 10 of the probe, if the signal contact part 9 is accurately positioned on the signal electrode pad 12, the grounding contact parts 10 are automatically positioned on the grounding electrode pads 13. Since the front end of the waveguide 4 is not covered with the grounding conductor, the ridge 8 is seen from the outside. Therefore, the signal contact part 9 on the tip of the ridge 8 is easily positioned on the signal electrode pad 12 according to the position of the ridge 8. In addition, since the signal contact part 9 and the grounding contact parts 10 are arranged parallel to each other on the edge of the waveguide, contact conditions of the contact parts 9 and 10 with the electrode pads 12 and 13 are confirmed visually. In addition, since the front end of the waveguide 4 is open, no reflection of high frequency signals at the end of the waveguide affects the impedance of the probe, resulting in a simple design of the probe.

In this state, millimeter wave signals at about 100 GHz are applied to the input terminal of the high frequency band IC chip from the probe in contact with the input terminal, and microwave signals output to the output terminal of the IC chip are received by the probe in contact with the output terminal. Then, the microwave signals are sent to a measuring apparatus where the characteristics of the IC chip are measured.

If the device to be tested is, for example, an individual high frequency transistor having an input terminal to which both a high frequency input signal and a DC signal are input and an output terminal from which both high frequency output signal and DC signal are output, it is necessary to input or output both the high frequency signal and DC signal through the signal contact part of the high frequency wafer probe. In the above-described first embodiment, since the potential of the ridge 8 is equal to the potential of the grounding conductor 4, i.e., the ridge 8 is grounded, the potential of the signal contact part cannot be controlled. Therefore, the probe of the first embodiment is not suitable for characteristic measurement of the individual high frequency transistors or the like.

Figure 3A:
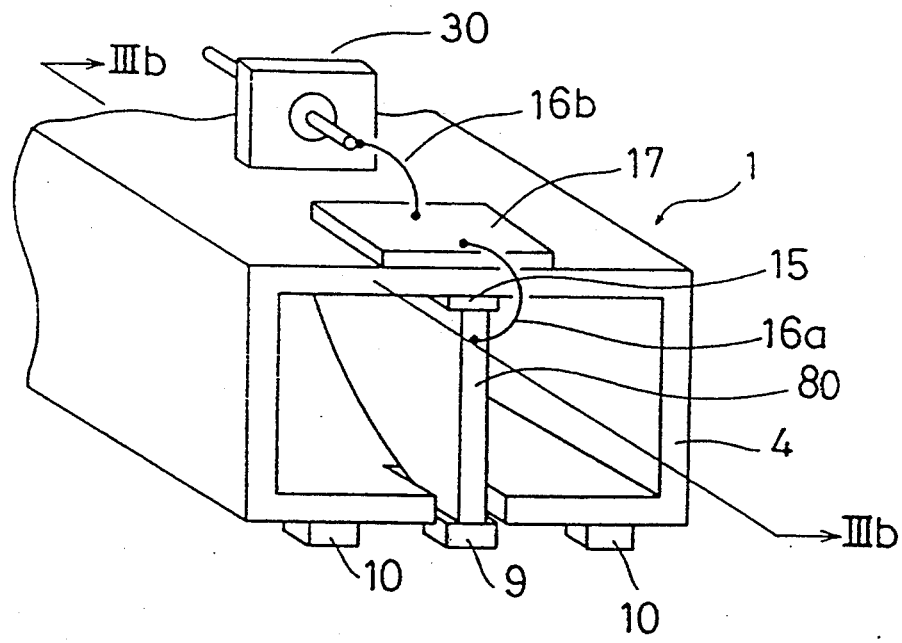
FIG. 3(a) is a perspective view illustrating a high frequency wafer probe according to a second embodiment of the present invention and FIG. 3(b) is a cross section taken along line IIIb—IIIb of FIG. 3(a)
Figure 3B:
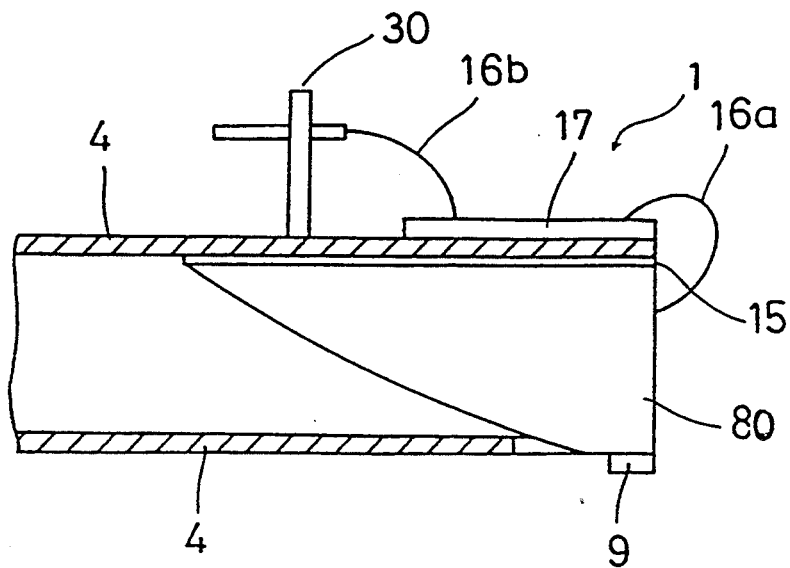

FIGS. 3(a) and 3(b) are diagrams illustrating a high frequency wafer probe suitable for characteristic measurement of the high frequency device having input and output terminals common to high frequency and DC signals, according to a second embodiment of the present invention, in which FIG. 3(a) is a perspective view and FIG. 3(b) is a cross section taken along line IIIb—IIIb of FIG. 3(a). The structure of FIGS. 3(a) and 3(b) is identical to the structure of FIGS. 1(a) and 1(b) except that the ridge 80 is separated from the internal upper wall of the waveguide 4 by a DC blocking dielectric layer 15. A dielectric substrate 17 and a condenser 30 are disposed on the top of the waveguide 4. A bias circuit is disposed on the dielectric substrate 17. The ridge 80 is connected to the bias circuit by a wire 16a. The bias circuit is connected to the condenser 30 by a wire 16b.

Figure 4:
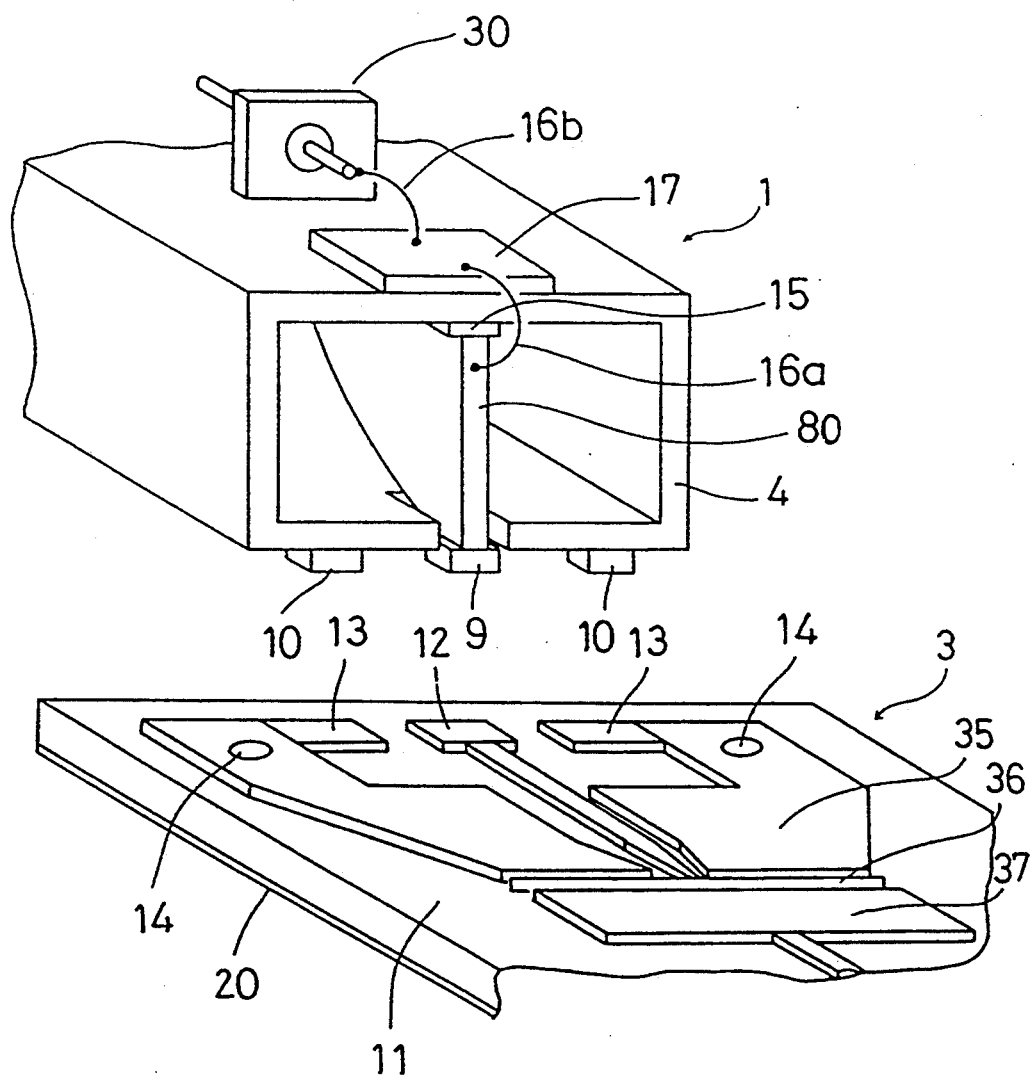
FIG. 4 is a perspective view illustrating characteristic measurement of a high frequency band IC using the probe of FIGS. 3(a) and 3(b)

FIG. 4 is a perspective view illustrating characteristic measurement of a high frequency device using the probe of FIGS. 3(a) and 3(b). In FIG. 4, a source-grounded type high frequency transistor 3 having input and output terminals common to high frequency and DC signals are used as a device to be tested. A gate signal input part of the transistor 3 has a coplanar line structure including a signal electrode pad 12 disposed at an end of a signal line that is disposed on a semiconductor substrate 11 and grounding electrode pads 13 connected to a grounding conductor 20 on the rear surface of the substrate 11 through via holes 14. A source electrode 35 is grounded through the via holes 14 and a drain electrode 37 is connected to an output terminal of the coplanar line structure. In the measurement, the signal contact part 9 and the grounding contact parts 10 of a probe for supplying the transistor 3 with signals (hereinafter referred to as a signal input side probe) are applied to the signal electrode pad 12 and the grounding electrode pads 13 of the transistor 3, respectively, and the signal contact part 9 and the grounding contact parts 10 of a probe for receiving output signals from the transistor 3 (hereinafter referred to as a signal output side probe) are applied to a signal electrode pad and grounding electrode pads (not shown) on the output terminal side of the transistor 3, respectively. In this state, a high frequency signal and DC bias voltage are applied to the signal electrode pad 12 of the transistor 3 from the signal contact part 9 of the signal input side probe, and high frequency output signal and DC signal output to the output terminal side signal electrode pad of the transistor are taken out by the signal contact part of the signal output side probe. Then, signals thus received are sent to a measuring apparatus where characteristics of the transistor are measured.

In this second embodiment, since the ridge 80 and the signal contact part 9 are electrically isolated from the grounded waveguide 4, the potentials thereof can be freely set. The potential of the ridge 80 is set from via the condenser 30, the wire 16b, the bias circuit 17, and the wire 16a. The wire 16a has large inductance and does not let the high frequency signal through, so that the impedance of the probe in the measuring frequency range is not affected by the high frequency signal. While in this second embodiment the condenser 30 prevents oscillation of the device under test, a circuit for preventing the oscillation may be included in the bias circuit 17.

While in the second embodiment voltage is applied to the ridge 80 via the bias circuit 17, the bias circuit 17 may be dispensed with. In addition, conductor ribbons may be used in place of the wires 16a and 16b.

Figure 5A:
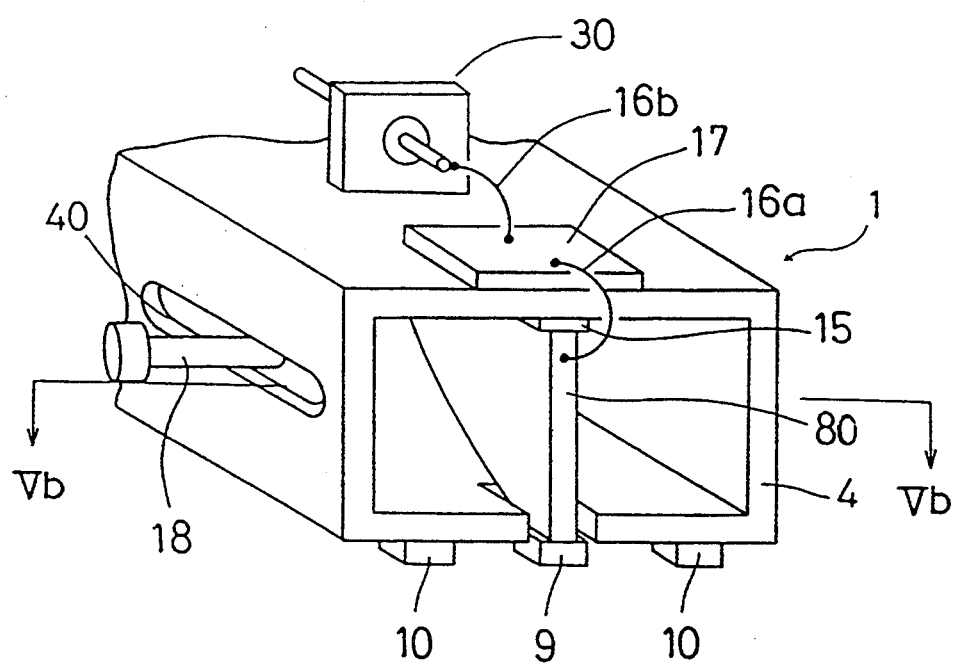
FIG. 5(a) is a perspective view illustrating a high frequency wafer probe according to a third embodiment of the present invention and FIG. 5(b) is a cross section taken along line Vb—Vb of FIG. 5(a)
Figure 5B:
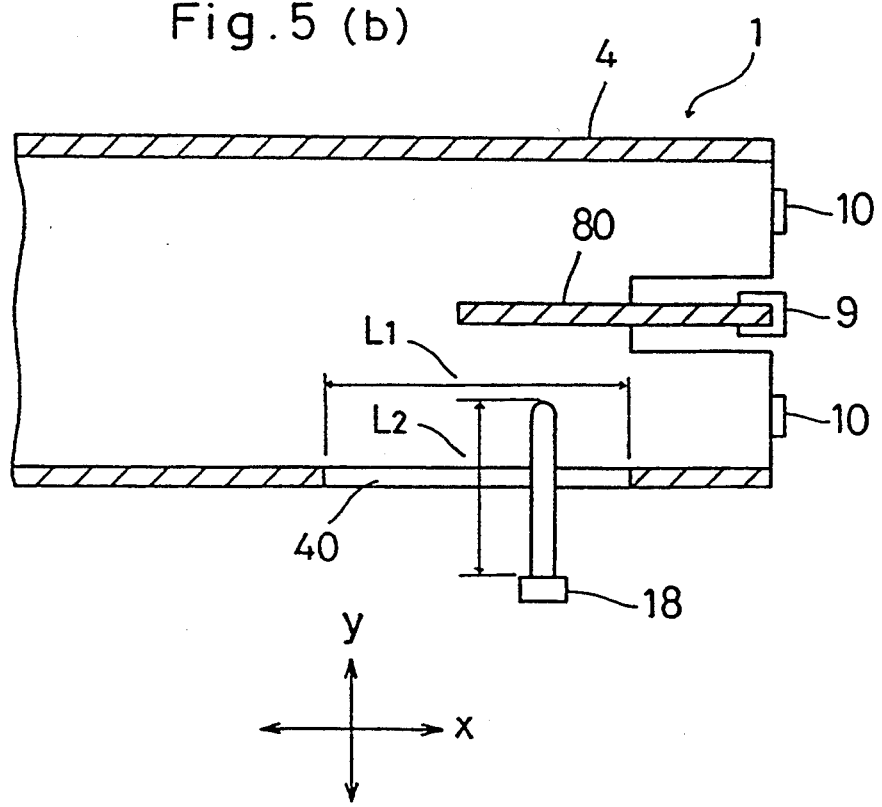

FIGS. 5(a) and 5(b) are diagrams illustrating a high frequency wafer probe according to a third embodiment of the present invention, in which FIG. 5(a) is a perspective view thereof and FIG. 5(b) is a cross section taken along line Vb—Vb of FIG. 5(a). This structure is identical to the structure of FIGS. 3(a) and 3(b) except that an opening 40 extending in a signal waveguide direction penetrates the side wall of the waveguide 4 and a movable stub comprising a conductor is inserted in the opening 40. The length $L_1$ of the opening 40 is more than a quarter wavelength and the length $L_2$ of the stub 18 is about a quarter wavelength.

Figure 6:
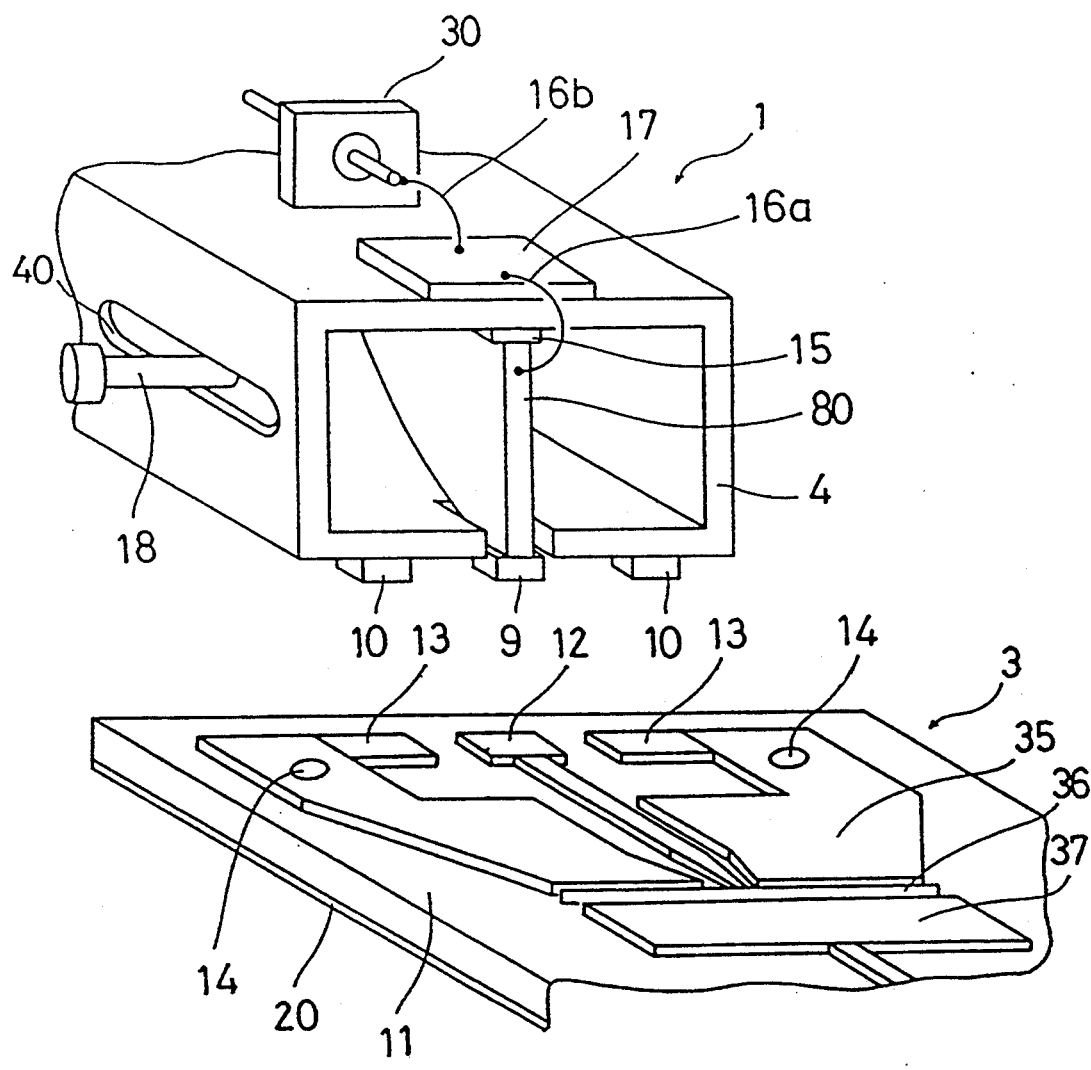
FIG. 6 is a perspective view illustrating characteristic measurement of a high frequency band IC using the probe of FIGS. 5(a) and 5(b)

FIG. 6 is a perspective view illustrating characteristic measurement of a high frequency band IC using the probe of FIG. 5(a). In FIG. 6, the same reference numerals as in FIG. 4 designate the same or corresponding parts. In the measurement, similarly as in the second embodiment, the signal contact part 9 and the grounding contact parts 10 of the signal input side probe are applied to the signal electrode pad 12 and the grounding electrode pads 13 of the high frequency band transistor, respectively, while the signal contact part 9 and the grounding contact parts 10 of the signal output side probe are applied to the signal electrode pad and the grounding electrode pads on the output terminal side (not shown) of the transistor, respectively. The grounding electrode pads constitute a coplanar line with the output terminal. In this state, high frequency signals and DC signals are applied to the signal electrode pad 12 of the transistor from the signal contact part 9 of the signal input side probe, and high frequency output signals and DC signals output to the signal electrode pad on the output terminal side of the transistor are received by the signal contact part 9 of the signal output side probe.

In this embodiment, the phase and absolute value of impedance at the facet of the transistor under test are adjusted by moving the stub 18 in the waveguide longitudinal direction and the waveguide width direction, respectively shown by x and y in FIG. 5(b). Since the movable stub 18 is about a quarter wavelength long, i.e., less than 1 mm, it can be driven by a braking motor utilizing a micromachine technique.

While in the above-described third embodiment the movable stub is included in the high frequency wafer probe of the second embodiment shown in FIGS. 3(a) and 3(b), the stub may be included in the high frequency IC probe of the first embodiment shown in FIGS. 1(a) and 1(b).

Figure 20:
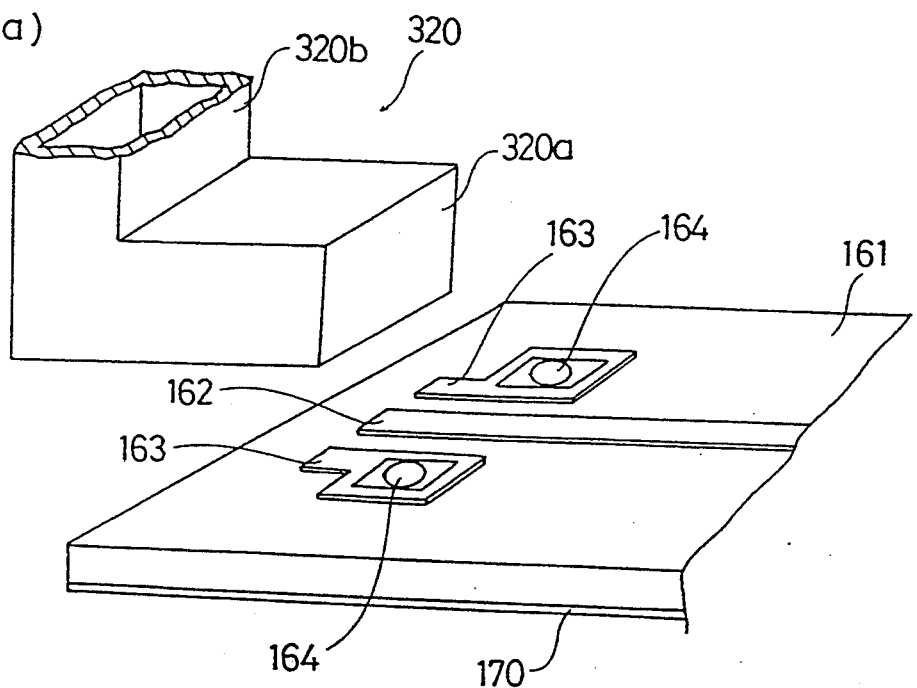
FIGS. 20(a) and 20(b) are diagrams for explaining problems in the high frequency wafer probe of FIGS. 19(a) and 19(b).
Figure 20:
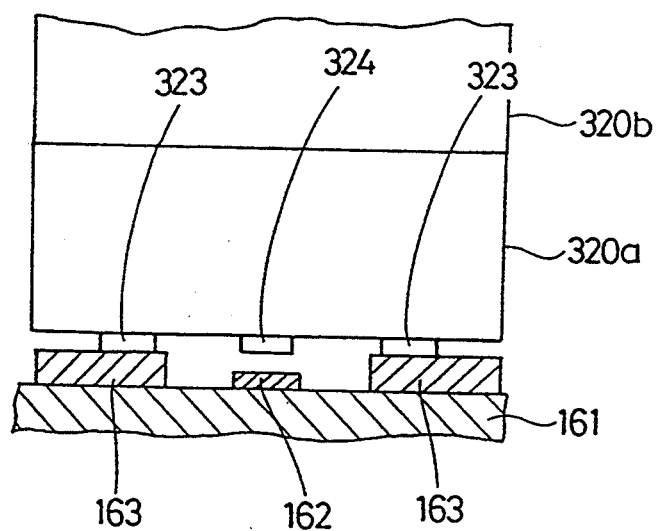

Meanwhile, when the planarity of the surface of the device to be tested is poor, particularly when the grounding electrode pads are higher than the signal electrode pad as shown in FIG. 20(b) or when the signal electrode pad is higher than the grounding electrode pads, the contact parts of the probe are not favorably in contact with the electrode pads of the device, adversely affecting the precision of the measurement.

Figure 7A:
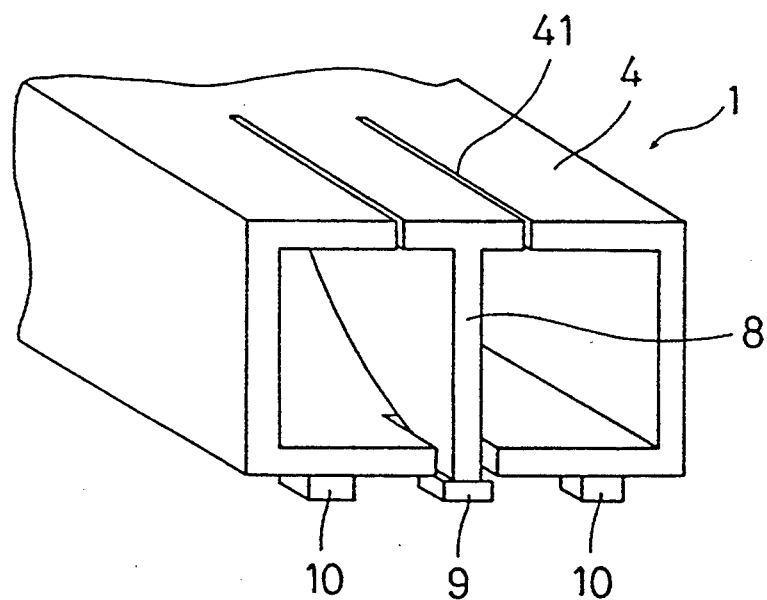
FIG. 7(a) is a perspective view illustrating a high frequency wafer probe according to a fourth embodiment of the present invention and FIG. 7(b) is a perspective view illustrating characteristic measurement of a high frequency band IC using the probe of FIG. 7(a)
Figure 7B:
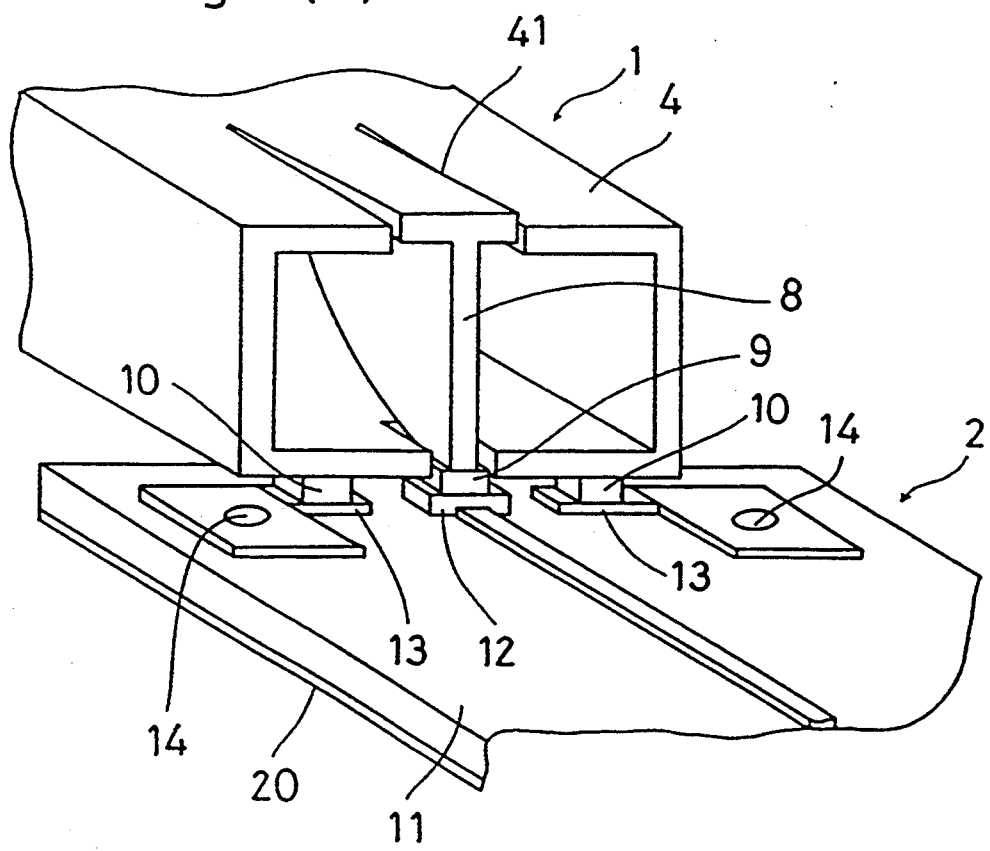

FIG. 7(a) is a perspective view illustrating a high frequency wafer probe in accordance with a fourth embodiment of the present invention, which can be used to make a precise measurement even if the planarity of the surface of the device to be tested is poor. FIG. 7(b) illustrates the probe during the measurement. The structure of FIG. 7(a) is identical to the structure of FIG. 1(a) except that slits 41 are present in the grounding conductor 4 at opposite sides of the ridge 8.

When the planarity of the IC surface is poor, for example, when the signal electrode pad 12 is higher than the grounding electrode pads 13 as shown in FIG. 7(b), a part of the grounding conductor 4 between the slits 41 warps upward to absorb the level difference on the IC surface, resulting in a perfect contact between the contact parts of the probe and the pads of the IC.

When the surfaces of the signal contact part 9 and the grounding contact parts 10 are level with each other as shown in FIG. 7(a), however, if the grounding electrode pads 13 are higher than the signal electrode pad 12, the signal contact part 9 does not reach the signal electrode pad 12.

Figure 8:
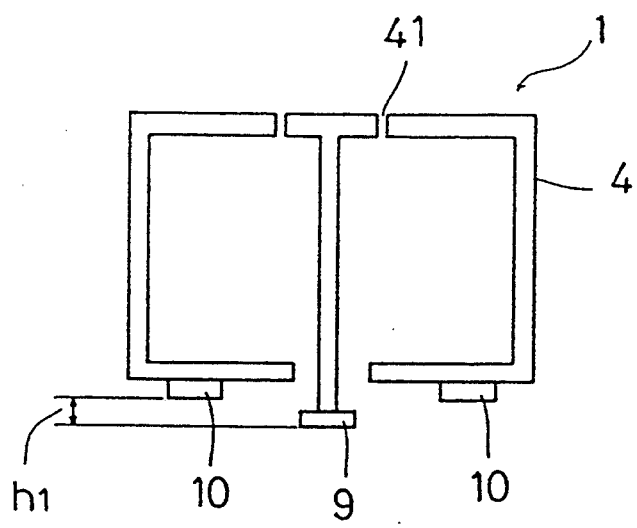
FIGS. 8(a) and 8(b) are diagrams illustrating a variation of the high frequency wafer of FIG. 7(a)
Figure 8:
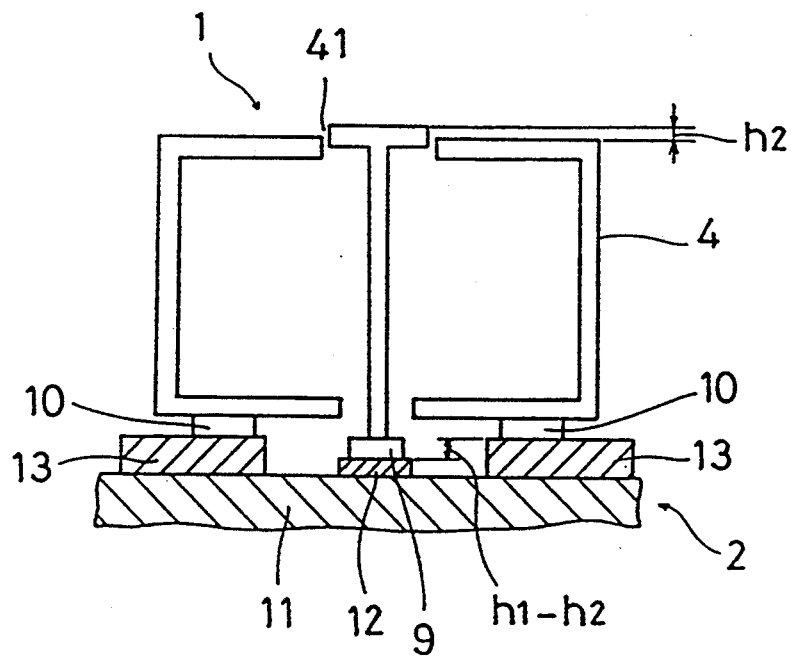

FIG. 8(a) shows a variation of the probe of the fourth embodiment, in which the height of the ridge is increased to make the signal contact part 9 protrude. In this structure, a favorable contact condition is achieved as shown in FIG. 8(b) even if the grounding electrode pads are higher than the signal electrode pad. The level difference $h_1$ is set according to an expected level difference between the electrode pads on the device to be tested. Instead of increasing the height of the ridge 8, the thickness of the signal contact part 9 may be increased.

While in the above-described fourth embodiment the slits 41 are present in the grounding conductor of the high frequency wafer probe of the first embodiment, the high frequency wafer probes of the second and third embodiments may be include slits with the same effects as described above.

Figure 18:
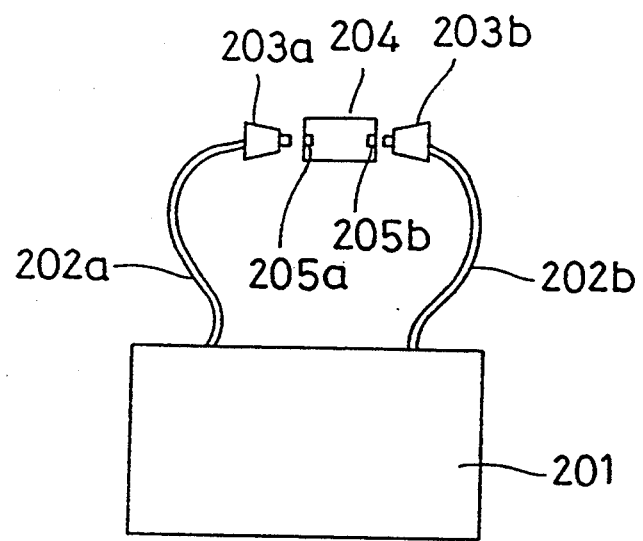
FIG. 18 is a schematic diagram illustrating an apparatus for measuring characteristics of a high frequency band IC.
Figure 19A:
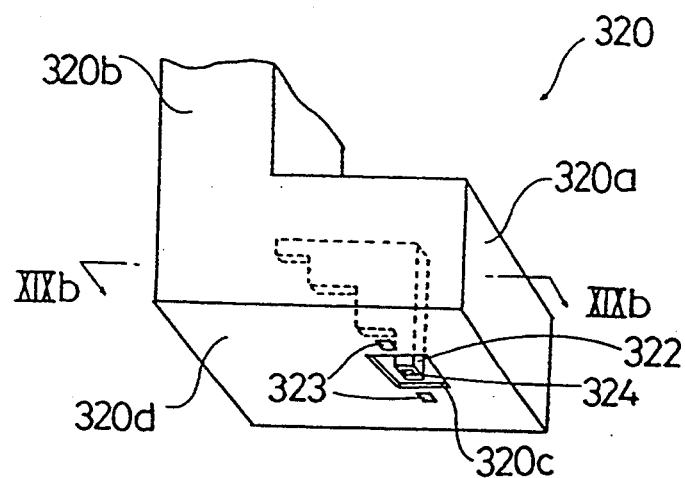
FIGS. 19(a) and 19(b) are diagrams illustrating a high frequency wafer probe performing a direct transition from a waveguide to an interface part of an IC, according to the prior art.
Figure 19B:
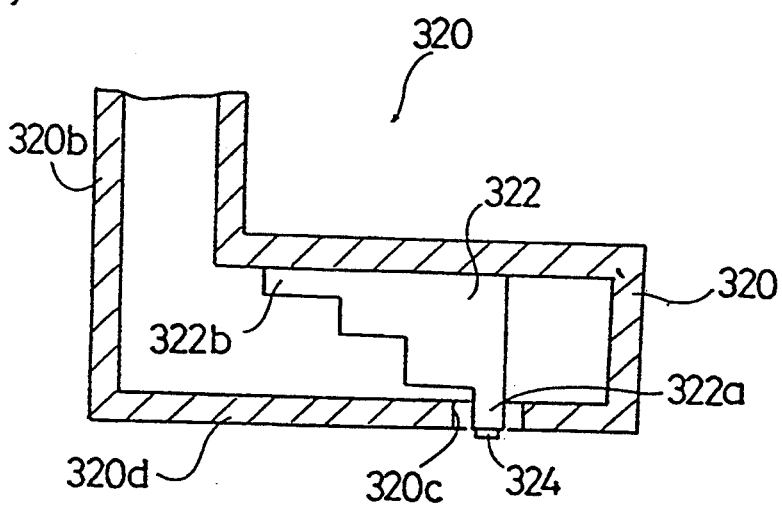

Generally, a pair of high frequency wafer probes, i.e., a probe for supplying the input terminal of the high frequency band IC with high frequency signals and a probe for receiving the high frequency signals from the output terminal of the IC, are used in the characteristic measurement of the IC, as shown in FIG. 18. However, since the high frequency wafer probes according to the first to fourth embodiments have an open-ended structure, a little signal leakage occurs. Especially when the input and output side probes are opposed to each other with a short distance between them as described above, the mutual isolation is reduced.

Figure 9:
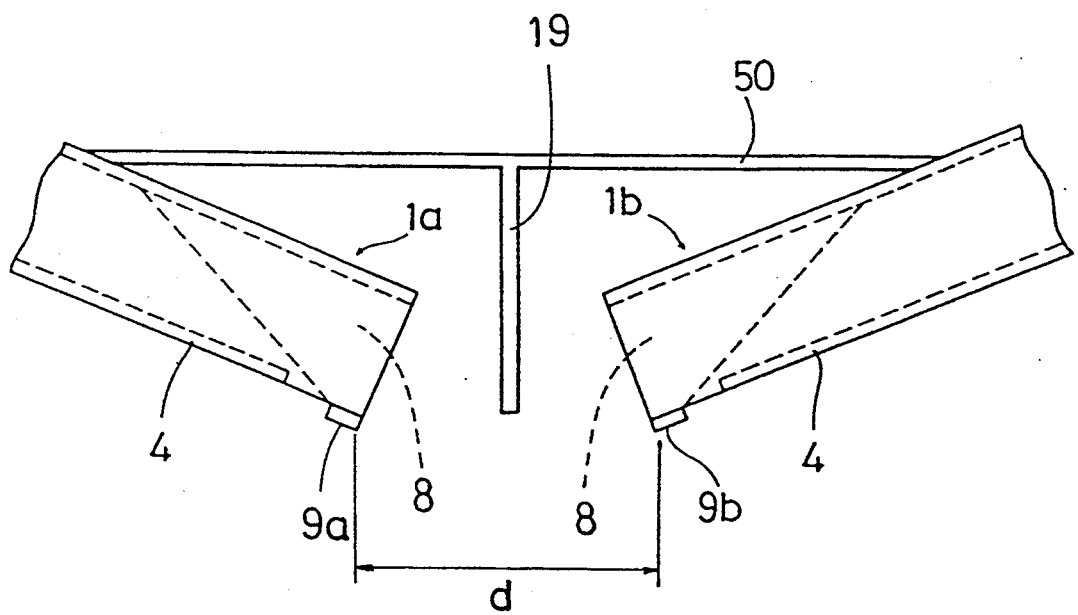
FIG. 9 is a diagram illustrating a high frequency wafer probe set according to a fifth embodiment of the present invention.

FIG. 9 is a side view of a pair of high frequency wafer probes in accordance with a fifth embodiment of the present invention. In FIG. 9, reference numeral 19 designates a shielding plate comprising a grounding conductor or a wave absorbing material. A signal input side probe 1a and a signal output side probe 1b are opposed to each other with a space d between signal contact parts 9a and 9b that is equal to a space between an input signal electrode pad and an output signal electrode pad of a device to be tested (not shown). The probes 1a and 1b are adhered to a conductor fixture 50 by welding or a conductive adhesive. When the shielding plate 19 comprises a grounding conductor, it can be united with the fixture 50. One of the probes of the above-described first to fourth embodiments is selected for the probes 1a and 1b according to a high frequency device to be tested. In FIG. 9, grounding contact parts are not shown.

Figure 10:
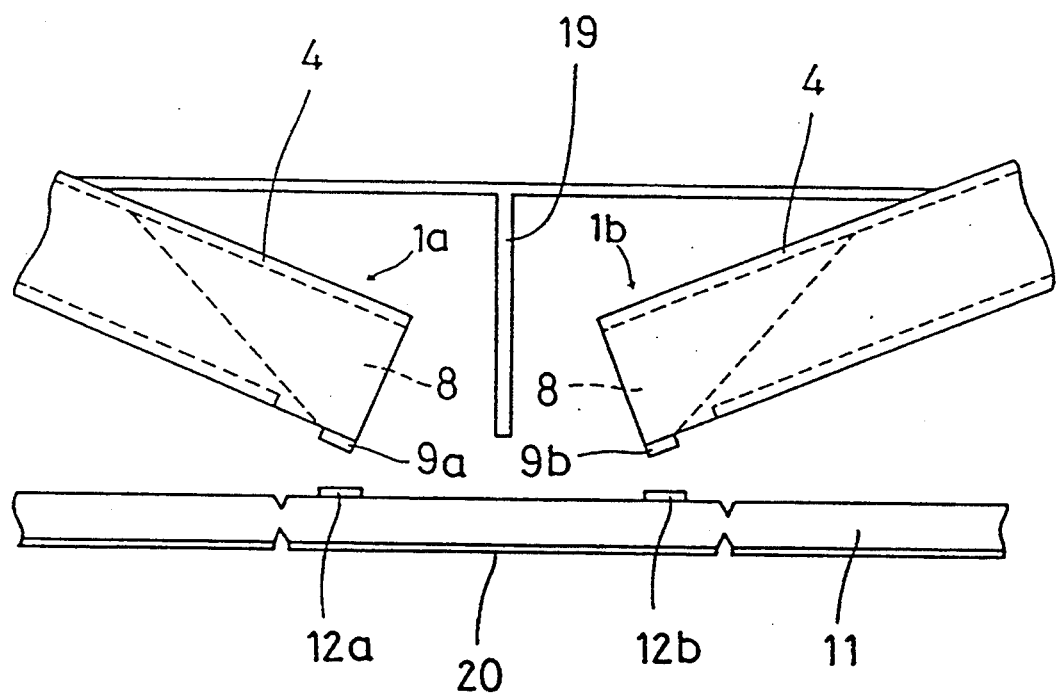
FIG. 10 is a diagram illustrating characteristic measurement of a high frequency band IC using the probe set of FIG. 9.
Figure 11:
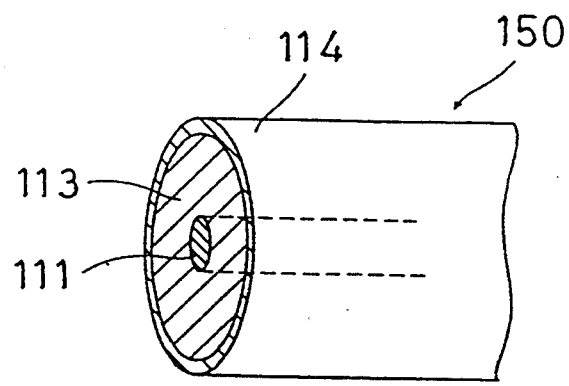
FIGS. 11(a)-11(c) are perspective views respectively illustrating a coaxial line, a coplanar line, and a rectangular waveguide according to the prior art.
Figure 11:
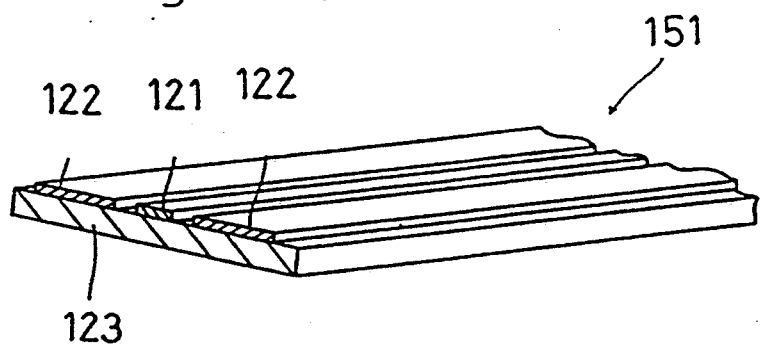
Figure 11:
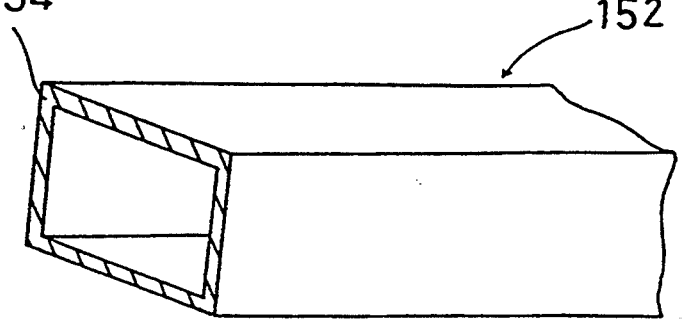
Figure 12:
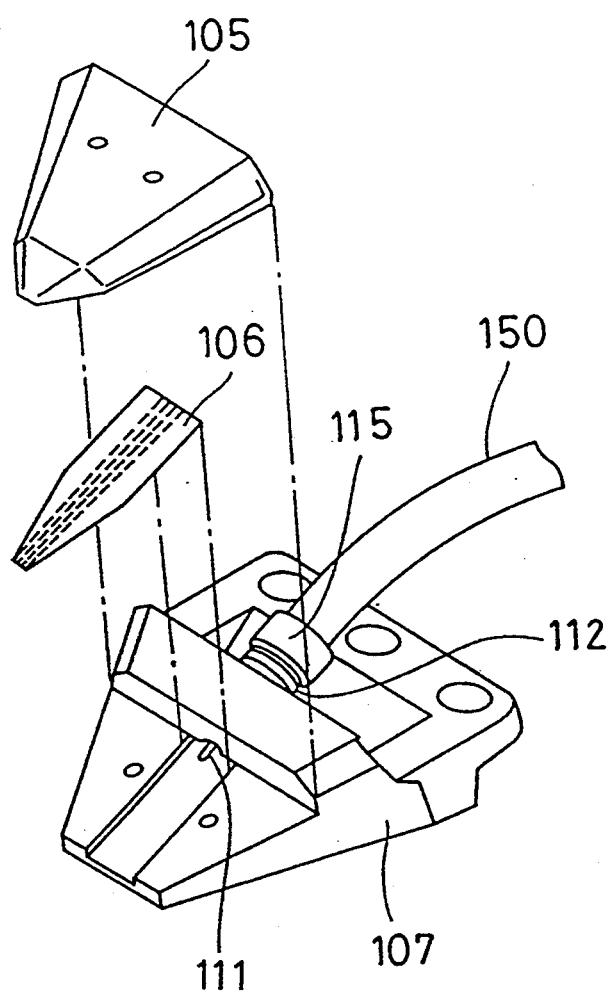
FIG. 12 is an exploded perspective view illustrating a coaxial type high frequency wafer probe in which a coaxial cable is converted to a coplanar line, according to the prior art.
Figure 13:
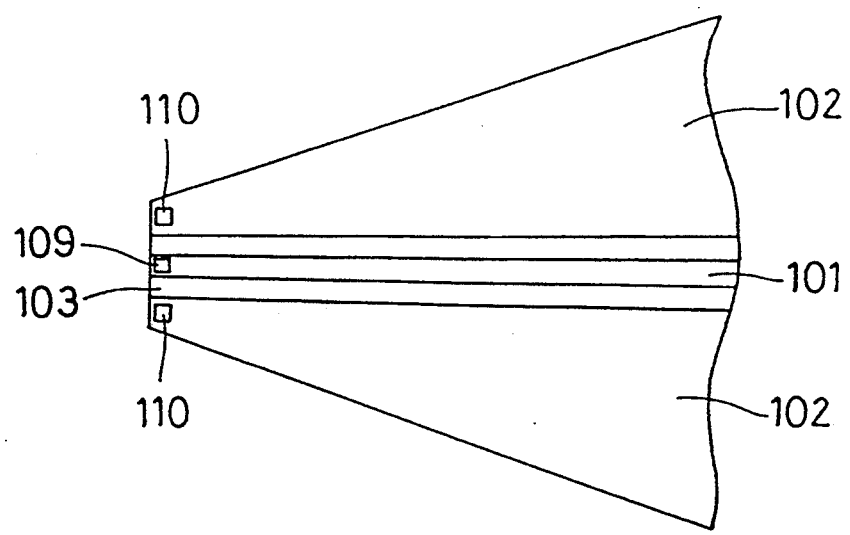
FIG. 13 is a diagram illustrating a rear surface of a dielectric blade (coplanar line) included in the probe of FIG. 12.
Figure 14:
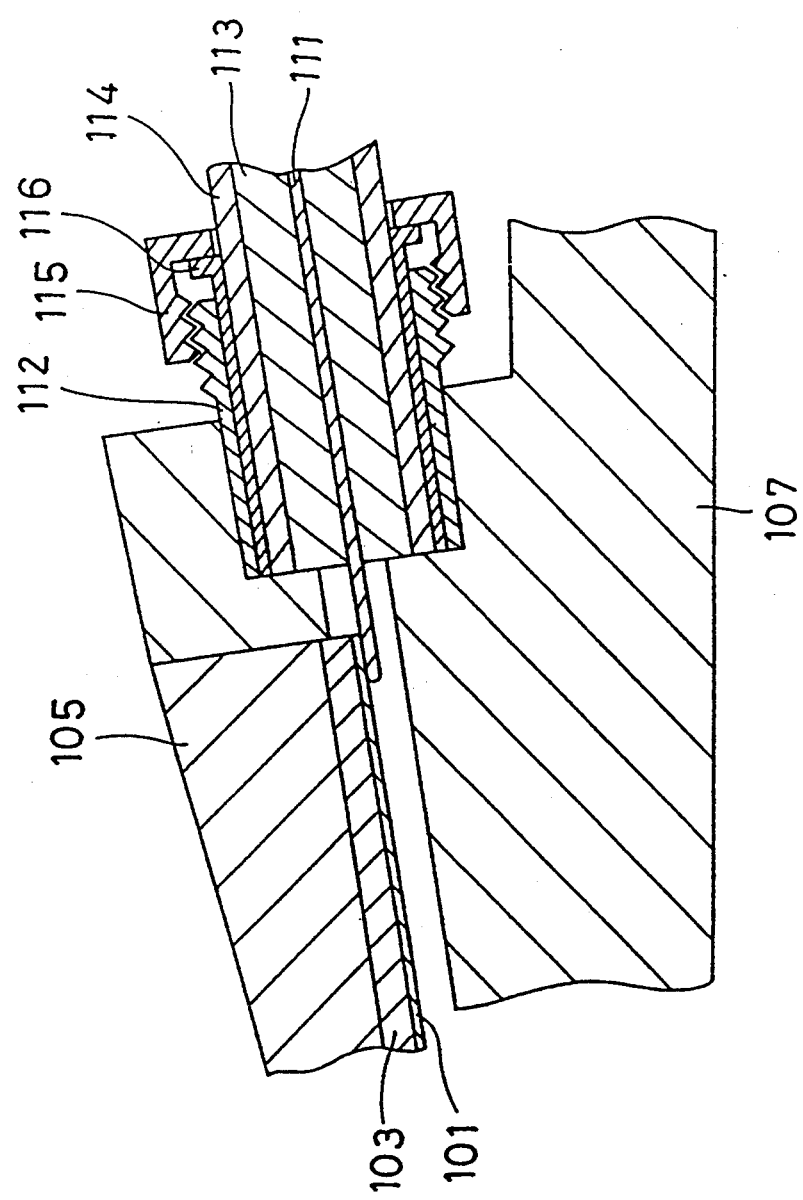
FIG. 14 is a cross section of the probe of FIG. 12, illustrating a coaxial cable to coplanar line transition part.
Figure 15A:
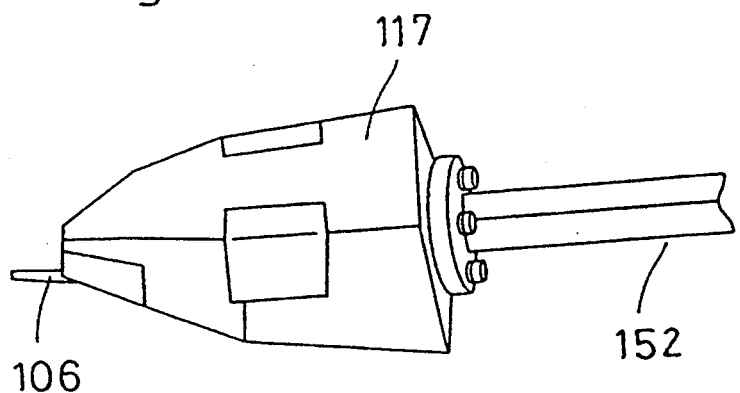
FIGS. 15(a) and 15(b) are diagrams illustrating a waveguide type high frequency wafer probe in which a waveguide is converted to a coplanar line, according to the prior art.
Figure 15B:
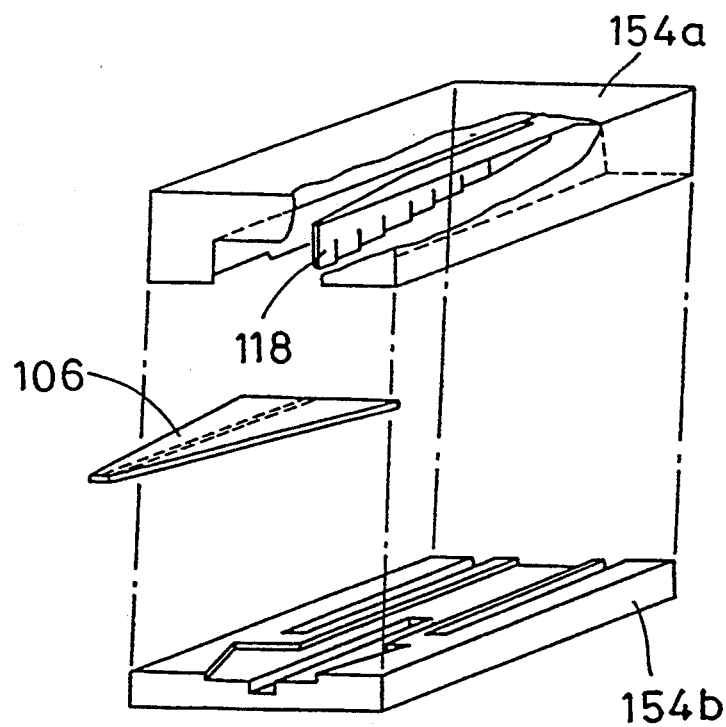
Figure 16A:
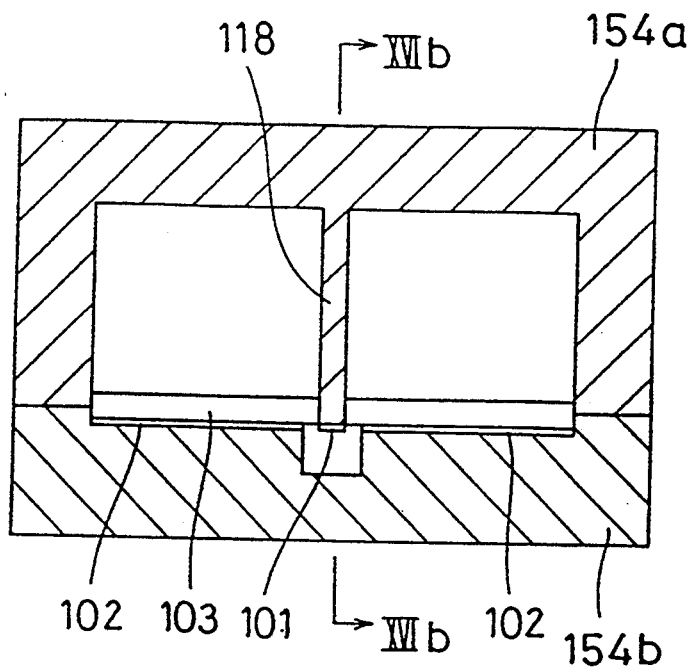
FIGS. 16(a) and 16(b) are sectional views of the structure shown in FIG. 15(b), illustrating the waveguide to coplanar line transition part of the probe of FIG. 15(b)
Figure 16B:
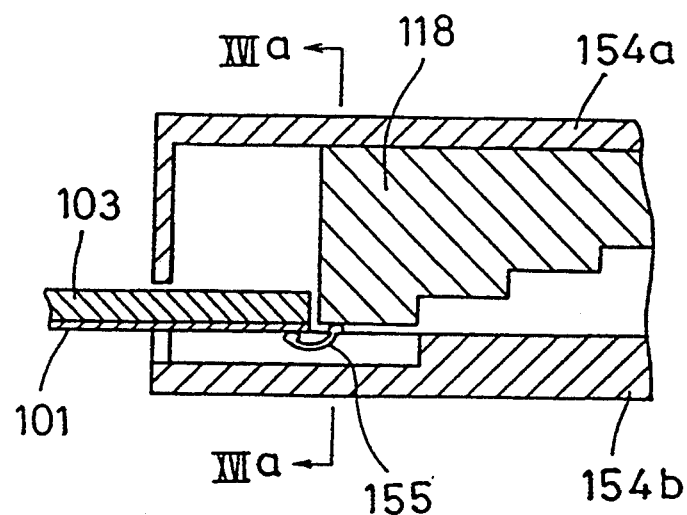
Figure 17:
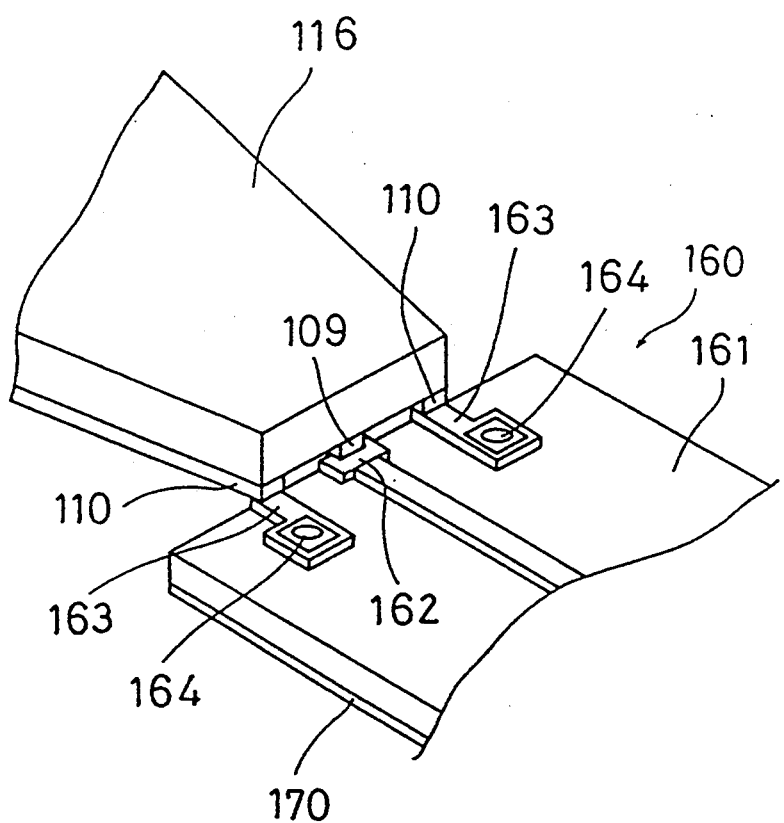
FIG. 17 is a perspective view illustrating characteristic measurement of a high frequency band IC using the high frequency wafer probe according to the prior art.

FIG. 10 is a schematic diagram illustrating characteristic measurement of a high frequency band IC using the probe set of FIG. 9. In FIG. 10, reference numerals 12a and 12b designate an input signal electrode pad and an output signal electrode pad of the high frequency band IC, respectively. During the measurement, the signal contact part 9a of the signal input side probe 1a is applied to the input signal electrode pad 12a of the IC while the signal contact part 9b of the signal output side probe 1b is applied to the output signal electrode pad 12b of the IC. Although it is not shown, grounding contact parts of the respective probes are applied to grounding electrode pads of the IC. In this state, high frequency signals are applied to the input signal electrode pad 12a from the signal contact part 9a, and high frequency signals output to the output signal electrode pad 12b are received by the signal contact part 9b to measure characteristics of the high frequency band IC. In this embodiment, since the shielding plate 19 comprising a grounding conductor or an electric wave absorbing material is present between the probes 1a and 1b, the probes are favorably isolated from each other.

While in the above-described fifth embodiment the probes 1a and 1b are adhered to the fixture 50, the probes may be screwed to the fixture. In this case, the interval d between the contact parts 9a and 9b is variable.

As is evident from the foregoing description, according to the present invention, a high frequency wafer probe includes a waveguide an end of which is open; a ridge disposed on the internal upper wall of the waveguide, the height of which gradually increases toward the open end of the waveguide; a signal contact part disposed on the tip of the ridge for contacting a signal input terminal of an IC chip to be tested; and a plurality of grounding contact parts disposed on the same plane as the signal contact part with the signal contact part between them for contacting a plurality of grounding terminals of the IC chip. Therefore, the contact parts of the probe may be accurately positioned on the electrode pads of the IC chip, and the contact conditions between them may be easily confirmed. In addition, a high frequency wafer probe with low loss and low reflection is achieved.

What is claimed is:

1. A high frequency wafer probe for measuring characteristics of a device operating in a high frequency range comprising:

a waveguide serving as a grounding conductor of said probe and having an open end, opposed top and bottom walls, and opposed side walls connecting said top and bottom walls;

an electrically conducting ridge having a tip and extending from said top wall toward said bottom wall within said waveguide in the vicinity of said open end, the ridge increasing in extent from said top wall as said open end is approached;

a dielectric layer disposed between said top wall and said ridge, electrically isolating said ridge from said waveguide with respect to direct current;

a signal contact part disposed on said tip of said ridge for contacting a signal input terminal on a device under test; and a plurality of grounding contact parts disposed on said bottom wall with said signal contact part disposed between two of said grounding contact parts for contacting respective grounding terminals of the device under test.

2. The high frequency wafer probe of claim 1 including a wire having an inductance connected to said ridge for supplying a DC voltage to said ridge.

3. The high frequency wafer probe of claim 1 comprising:
- a slot in one of said side walls generally parallel to said top wall ann having a length of λ/4 (λ:wavelength); and
- a stub inserted in said slot movable along and perpendicular to said slit.

4. A high frequency wafer probe for measuring characteristics of a device operating in a high frequency range comprising:
- a waveguide serving as a grounding conductor of said probe and having an open end, opposed top and bottom walls, and opposed side walls connecting said top and bottom walls;
- an electrically conducting ridge having a tip and extending from said top wall toward said bottom wall within said waveguide in the vicinity of said open end, the ridge increasing in extent from said top wall as said open end in approached;
- a signal contact part disposed on said tip of said ridge for contacting a signal input terminal on a device under test; and
- a plurality of grounding contact parts disposed on said bottom wall with said signal contact part between two of said grounding contact parts for contacting respective grounding terminals of the device under test wherein the top wall of said waveguide includes slits on opposite sides of and parallel to said ridge for deflection of said ridge relative to said bottom wall in response to a force applied to said signal contact part.

5. An apparatus for measuring characteristics of a device operating in a high frequency range comprising:
- a measuring apparatus body; and
- a plurality of probes connected to said apparatus via connecting cables, each of said probes including:
- a waveguide serving as a grounding conductor of said probe and having an open end, opposed top and bottom walls, and opposed side walls connecting said top and bottom walls;
- an electrically conducting ridge having a tip and extending from said top wall toward said bottom wall within said waveguide in the vicinity of said open end, the ridge increasing in extent from said top wall as said open end is approached;
- a dielectric layer disposed between said top wall and said ridge, electrically isolating said ridge from said waveguide with respect to direct current;
- a signal contact part disposed on said tip of said ridge for contacting a signal input terminal on a device under test; and
- a plurality of grounding contact parts disposed on said bottom wall with said signal contact part disposed between two of said grounding contact parts for contacting respective grounding terminals of the device under test.

6. The apparatus of claim 5 comprising a plate of one of a grounding conductor and an electrical wave absorbing material disposed between open ends of said probes.

* * * * *

UNITED STATES PATENT AND TRADEMARK OFFICE
CERTIFICATE OF CORRECTION

PATENT NO. : 5,408,188
DATED : April 18, 1995
INVENTOR(S) : Takayuki Katoh

It is certified that error appears in the above-indentified patent and that said Letters Patent is hereby corrected as shown below:

Column 11, Line 9, change "ann" to --and--;

Line 25, change "in" to --is--.

Signed and Sealed this

Eleventh Day of July, 1995

BRUCE LEHMAN

*Attest:*

*Attesting Officer*   Commissioner of Patents and Trademarks